(12) United States Patent
Katayama et al.

(10) Patent No.: US 11,908,501 B2
(45) Date of Patent: Feb. 20, 2024

(54) STORAGE DEVICE THAT READ DATA WHILE A SWITCHING ELEMENT OF A MEMORY CELL IS ON

(71) Applicant: KIOXIA CORPORATION, Tokyo (JP)

(72) Inventors: Akira Katayama, Yokohama Kanagawa (JP); Kosuke Hatsuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/462,449

(22) Filed: Aug. 31, 2021

(65) Prior Publication Data

US 2022/0293155 A1    Sep. 15, 2022

(30) Foreign Application Priority Data

Mar. 9, 2021    (JP) .................. 2021-037466

(51) Int. Cl.
  *G11C 11/16*    (2006.01)
(52) U.S. Cl.
  CPC ................. *G11C 11/1673* (2013.01)
(58) Field of Classification Search
  CPC .................................. G11C 11/1673
  USPC ....................................... 365/158
  See application file for complete search history.

(56) References Cited

U.S. PATENT DOCUMENTS

| | | | |
|---|---|---|---|
| 8,416,602 B2 | 4/2013 | Kitagawa et al. | |
| 10,650,889 B1* | 5/2020 | Berman | G11C 13/0097 |
| 2002/0126524 A1* | 9/2002 | Sugibayashi | G11C 11/1673 |
| | | | 365/158 |
| 2006/0221678 A1* | 10/2006 | Bedeschi | G11C 13/004 |
| | | | 365/163 |
| 2013/0301340 A1* | 11/2013 | Park | G11C 13/0097 |
| | | | 365/148 |
| 2016/0148678 A1* | 5/2016 | Park | G11C 13/004 |
| | | | 365/148 |
| 2018/0151230 A1* | 5/2018 | Park | G11C 16/24 |
| 2018/0301178 A1* | 10/2018 | Kim | G11C 11/1673 |
| 2019/0378567 A1 | 12/2019 | Gangasani et al. | |
| 2020/0090723 A1 | 3/2020 | Katayama | |
| 2020/0168273 A1* | 5/2020 | Kim | G11C 13/0004 |
| 2020/0350009 A1* | 11/2020 | Lee | G11C 13/0026 |

(Continued)

FOREIGN PATENT DOCUMENTS

JP    5521612 B2    6/2014

*Primary Examiner* — Sung Il Cho
(74) *Attorney, Agent, or Firm* — Kim & Stewart LLP

(57) ABSTRACT

A storage device includes a first interconnection, a second interconnection, a memory cell connected between the first and second interconnections and including a variable resistance element and a switching element that is connected in series to the variable resistance element, and a control circuit configured to exercise control of a read operation to read data stored in the memory cell. The control circuit exercises control in such a manner as to set the first interconnection which has been charged with a first voltage and the second interconnection which has been charged with a second voltage into floating states, to set the switching element into an on-state by discharging the second interconnection set into the floating state to thereby increase a voltage applied to the memory cell, and to read the data stored in the memory cell in a state in which the switching element is set into the on-state.

20 Claims, 6 Drawing Sheets

(56) References Cited

U.S. PATENT DOCUMENTS

| | | | |
|---|---|---|---|
| 2021/0027835 A1* | 1/2021 | Lee | G11C 13/0026 |
| 2021/0027837 A1* | 1/2021 | Kim | G11C 11/4074 |

* cited by examiner

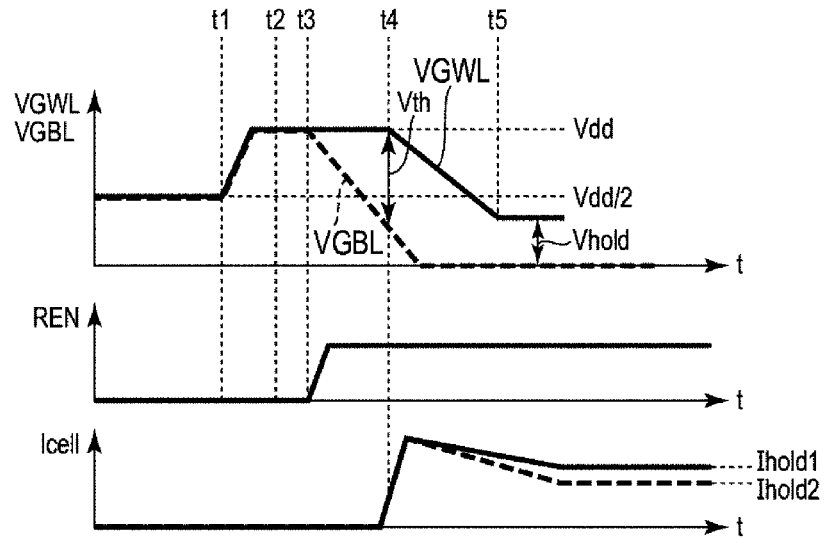
FIG. 7A
FIG. 7B
FIG. 7C
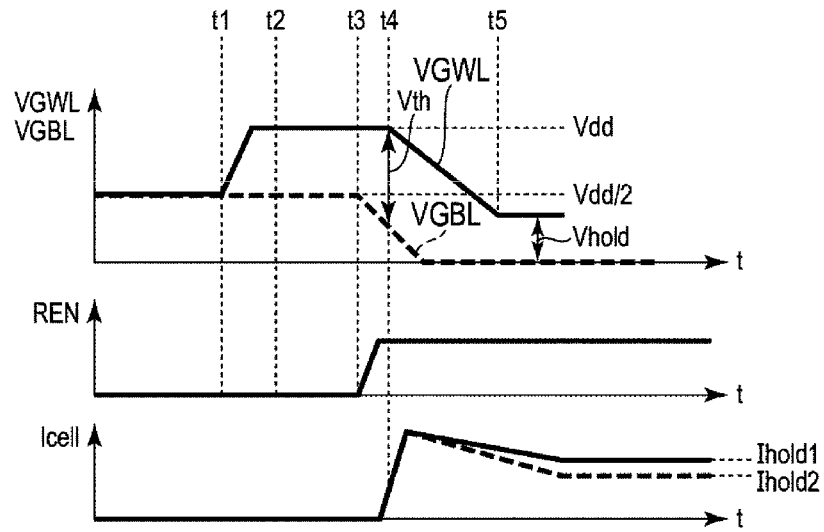
FIG. 8A
FIG. 8B
FIG. 8C

STORAGE DEVICE THAT READ DATA WHILE A SWITCHING ELEMENT OF A MEMORY CELL IS ON

CROSS-REFERENCE TO RELATED APPLICATION(S)

This application is based upon and claims the benefit of priority from Japanese Patent Application No. 2021-037466, filed Mar. 9, 2021, the entire contents of which are incorporated herein by reference.

FIELD

Embodiments described herein relate generally to a storage device.

BACKGROUND

A nonvolatile storage device that includes memory cells each including a series-connection of a variable resistance memory element such as a magnetoresistive effect element and a switching element is proposed.

BRIEF DESCRIPTION OF THE DRAWINGS

FIGS. 7A to 7C are timing charts illustrating an example of the read operation carried out by the storage device according to the embodiment.

FIGS. 8A to 8C are timing charts illustrating another example of the read operation carried out by the storage device according to the embodiment.

DETAILED DESCRIPTION

Embodiments provide a storage device capable of reliably performing a read operation.

In general, according to one embodiment, a storage device includes a first interconnection that extends in a first direction, a second interconnection that extends in a second direction crossing the first direction, a memory cell connected between the first interconnection and the second interconnection and including a variable resistance memory element and a switching element that is connected in series to the variable resistance memory element between first and second ends of the memory cell respectively connected to the first and second interconnections; and a control circuit configured to exercise control of a read operation to read data stored in the memory cell. The control circuit exercises control in such a manner as to set the first interconnection which has been charged with a first voltage and the second interconnection which has been charged with a second voltage into floating states, to set the switching element into an on-state by discharging the second interconnection set into the floating state to thereby increase a voltage applied to the memory cell, and to read the data stored in the memory cell in a state in which the switching element is set into the on-state.

Embodiments will be described hereinafter with reference to the drawings.

Figure 1:
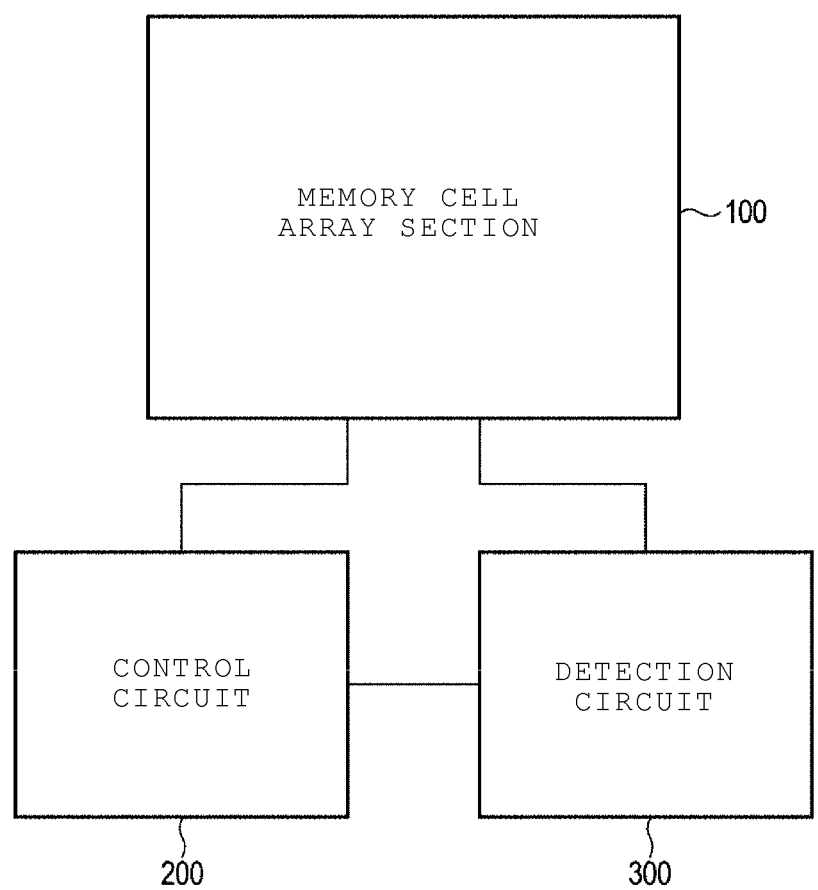
FIG. 1 is a block diagram showing overall schematic configurations of a storage device according to an embodiment.

FIG. 1 is a block diagram showing overall schematic configurations of a storage device (e.g., nonvolatile storage device) according to an embodiment. It is noted that a magnetic storage device will be described hereinafter as an example of the storage device.

The magnetic storage device according to the present embodiment includes a memory cell array section 100, a control circuit 200, and a detection circuit 300.

Figure 2A:
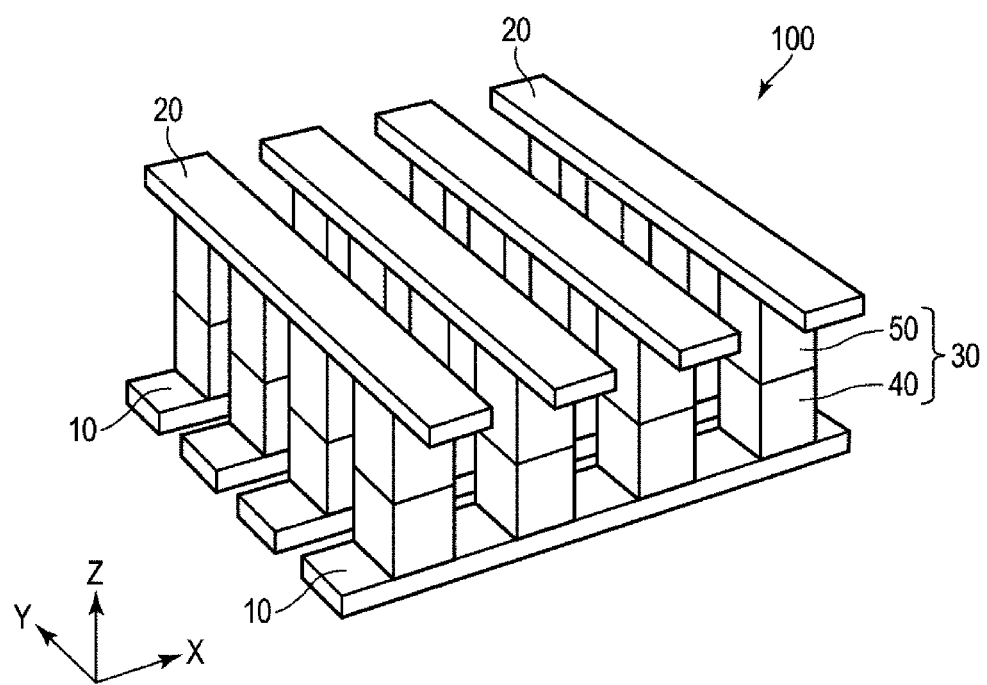
FIG. 2A is a perspective view schematically showing configurations of a memory cell array section in the storage device according to the embodiment.

FIG. 2A is a perspective view schematically showing configurations of the memory cell array section 100.

The memory cell array section 100 includes a plurality of word lines (also referred to herein as first interconnections) 10 that are provided on a base region, not shown, including a semiconductor substrate, not shown, and that extend in an X direction, a plurality of bit lines (also referred to herein as second interconnections) 20 that extend in a Y direction, and a plurality of memory cells 30 connected between the plurality of word lines 10 and the plurality of bit lines 20.

It is noted that the X direction, the Y direction, and a Z direction shown in the drawings are directions crossing one another. More specifically, the X direction, the Y direction, and the Z direction are orthogonal to one another.

The word lines 10 and the bit lines 20 each supply a predetermined signal to each memory cell 30 when data is written to or read from the memory cell 30. While the word lines 10 are located on a lower layer side and the bit lines 20 are located on an upper layer side in FIG. 2A, the word lines 10 may be located on the upper layer side and the bit lines 20 may be located on the lower layer side.

Each memory cell 30 includes a magnetoresistive effect element 40 that is a variable resistance memory element, and a selector, i.e., switching element 50 connected in series to the magnetoresistive effect element 40 for selecting the magnetoresistive effect element 40.

Figure 2B:
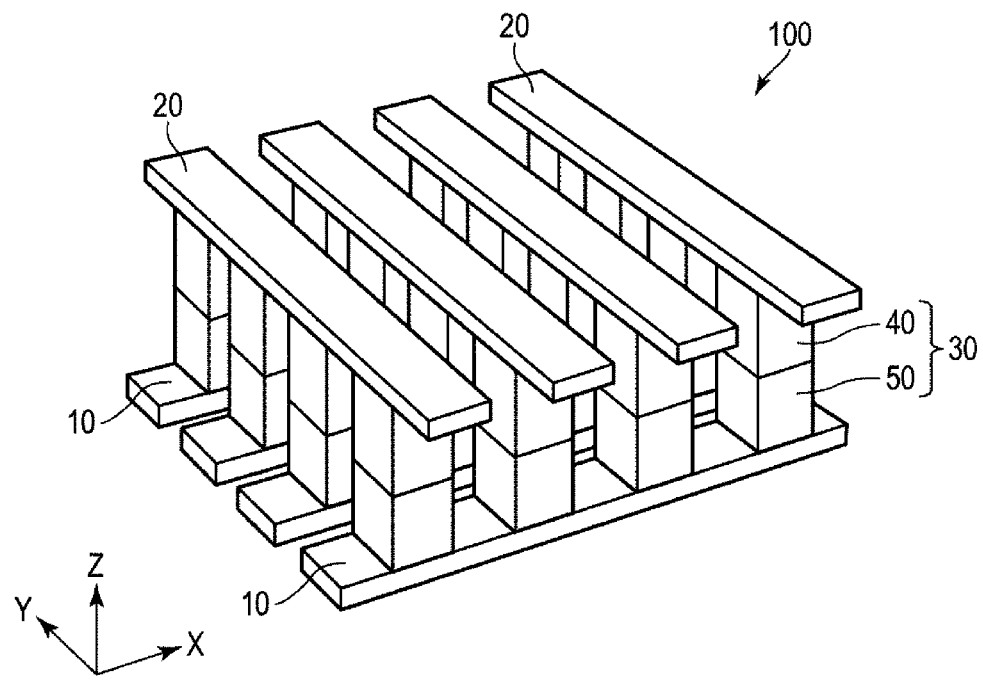
FIG. 2B is a perspective view schematically showing configurations of a modification of the memory cell array section in the storage device according to the embodiment.

While the magnetoresistive effect element 40 is located on a lower layer side and the selector 50 is located on an upper layer side in FIG. 2A, the magnetoresistive effect element 40 may be located on the upper layer side and the selector 50 may be located on the lower layer side as shown in FIG. 2B.

Figure 3:
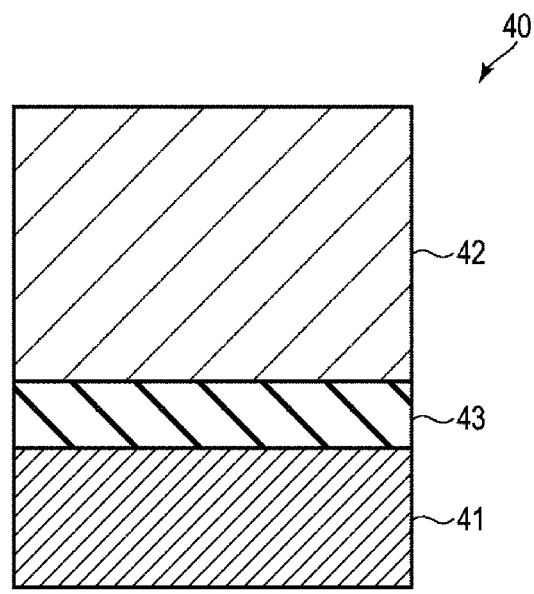
FIG. 3 is a cross-sectional view schematically showing configurations of a magnetoresistive effect element in the storage device according to the embodiment.

FIG. 3 is a cross-sectional view schematically showing configurations of the magnetoresistive effect element 40.

In the present embodiment, a magnetic tunnel junction (MTJ) element is used as the magnetoresistive effect element 40. This magnetoresistive effect element 40 includes a storage layer, i.e., first magnetic layer 41, a reference layer, i.e., second magnetic layer 42, and a tunnel barrier layer, i.e., non-magnetic layer 43.

The storage layer 41 is a ferromagnetic layer having a variable magnetization direction. The variable magnetization direction means that a magnetization direction varies with respect to a write current. The reference layer 42 is a ferromagnetic layer having a fixed magnetization direction. The fixed magnetization direction means that a magnetization direction does not vary with respect to a predetermined write current. The tunnel barrier layer 43 is an insulating layer provided between the storage layer 41 and the reference layer 42.

When the magnetization direction of the storage layer 41 is parallel to the magnetization direction of the reference layer 42, the magnetoresistive effect element 40 is in a low resistance state in which a resistance of the magnetoresistive effect element 40 is relatively low. When the magnetization direction of the storage layer 41 is antiparallel to the magnetization direction of the reference layer 42, the magnetoresistive effect element 40 is in a high resistance state in which the resistance of the magnetoresistive effect element 40 is relatively high. Therefore, the magnetoresistive effect element 40 is capable of storing binary data in response to the resistance state (low resistance state or high resistance state). Furthermore, the low resistance state or the high resistance state can be set in the magnetoresistive effect element 40 depending on a direction of the write current.

While the magnetoresistive effect element 40 shown in FIG. 3 has a bottom free structure in which the storage layer 41 is located on a lower layer side and the reference layer 42 is located on an upper layer side, a magnetoresistive effect element having a top free structure in which the storage layer 41 is located on the upper layer side and the reference layer 42 is located on the lower layer side is also applicable.

Figure 4:
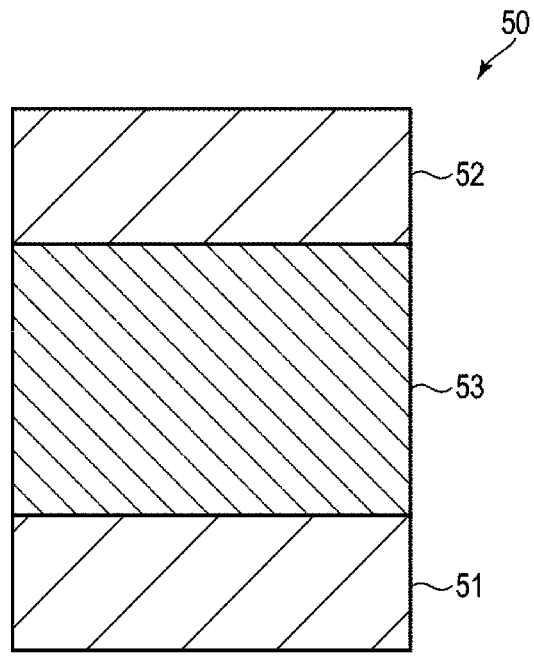
FIG. 4 is a cross-sectional view schematically showing configurations of a selector in the storage device according to the embodiment.

FIG. 4 is a cross-sectional view schematically showing configurations of the selector 50.

The selector 50 includes a lower electrode 51, an upper electrode 52, and a selector material layer, i.e., switching material layer 53 provided between the lower electrode 51 and the upper electrode 52. The selector 50 is a two-terminal switching element that exhibits nonlinear current-voltage characteristics. The selector 50 is set into a high resistance state, e.g., an electrically non-conductive state when a voltage applied across two terminals is lower than a threshold voltage, and is set into a low resistance state, e.g., an electrically conductive state when the voltage applied across the two terminals is equal to or higher than the threshold voltage.

Figure 5:
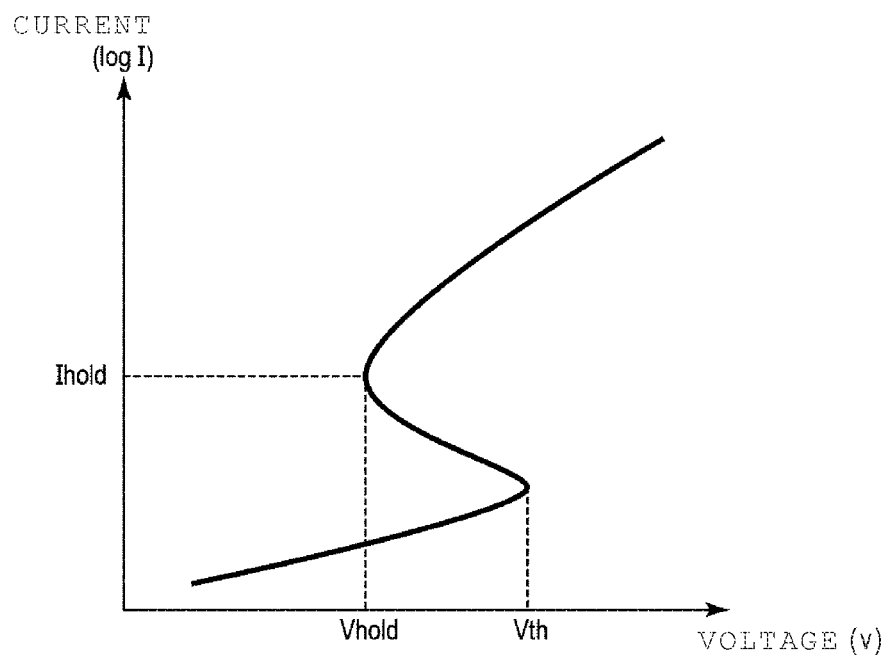
FIG. 5 schematically shows a relationship between a voltage applied across ends of a memory cell and a current that passes through the memory cell.

FIG. 5 schematically shows a relationship between a voltage applied across two ends of the memory cell 30 and a current that passes through the memory cell 30.

The selector 50 transitions into the low resistance state (on-state) when the voltage applied to the memory cell 30 increases to a level that is equal to or higher than a threshold voltage Vth, and transitions into the high resistance state (off-state) when the voltage applied to the memory cell 30 decreases to a level that is lower than a hold voltage Vhold. A hold current Ihold passes through the memory cell 30 when the voltage applied to the memory cell 30 is equal to the hold voltage Vhold. Applying the voltage equal to or higher than the threshold voltage Vth between one word line 10 and one bit line 20 causes the selector 50 to transition into the on-state and makes it possible to write data to or read data from the magnetoresistive effect element 40 connected in series to the selector 50.

A read operation by the storage device according to the present embodiment will next be described with reference to a circuit diagram shown in FIG. 6 and timing charts shown in FIG. 7A to 7C.

The storage device operates mainly under control of the control circuit 200 shown in FIG. 1. That is, a write operation of writing data to the magnetoresistive effect element 40 and the read operation of reading data stored in the magnetoresistive effect element 40 are performed mainly under control of the control circuit 200.

Figure 6:
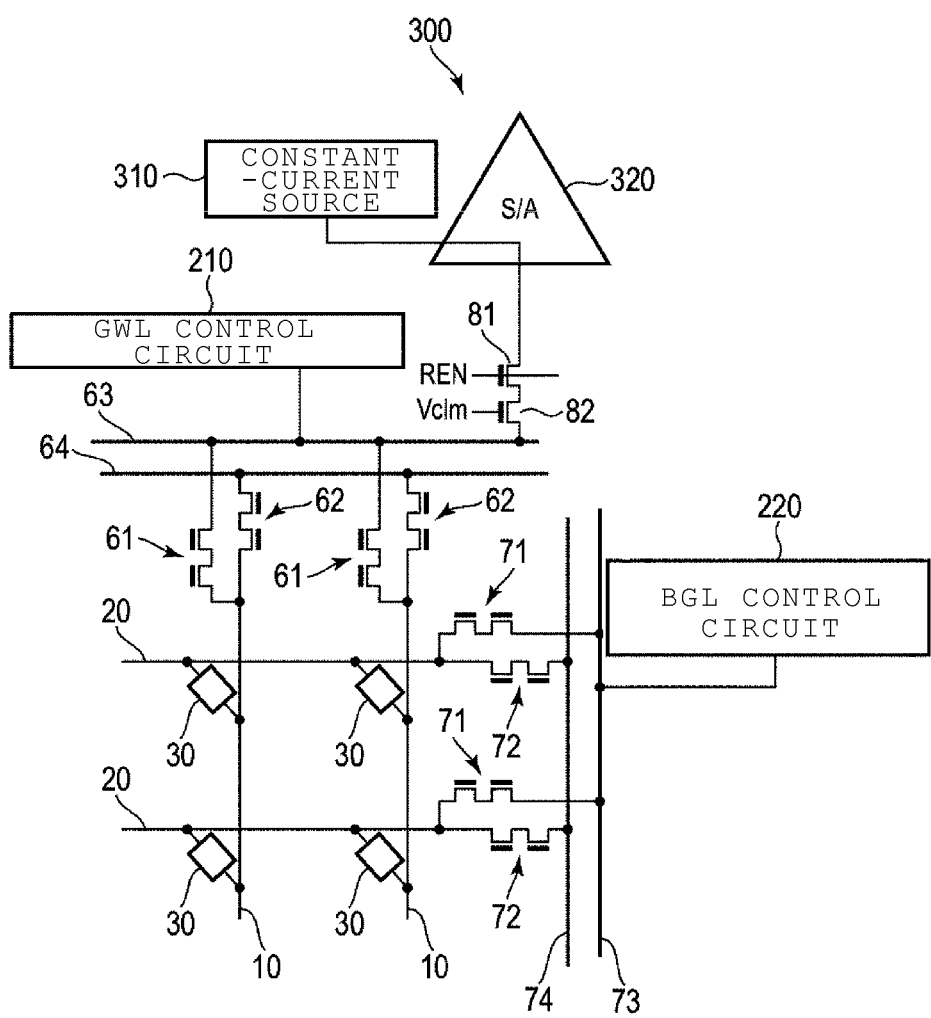
FIG. 6 is a circuit diagram illustrating a read operation carried out by the storage device according to the embodiment.

As shown in FIG. 6, one end of a switch circuit 61 and one end of a switch circuit 62 are connected to each word line 10, a global word line 63 is connected to the other end of the switch circuit 61, and a voltage supply line 64 is connected to the other end of the switch circuit 62. One end of a switch circuit 71 and one end of a switch circuit 72 are connected to each bit line 20, a global bit line 73 is connected to the other end of the switch circuit 71, and a voltage supply line 74 is connected to the other end of the switch circuit 72. A fixed voltage Vdd/2 is applied to each of the voltage supply lines 64 and 74.

A global word line (GWL) control circuit 210 is connected to the global word line 63, and a global bit line (GBL) control circuit 220 is connected to the global bit line 73. The control circuit 200 shown in FIG. 1 includes the global word line control circuit 210 and the global bit line control circuit 220.

The detection circuit 300 includes a constant-current source 310 and a sense amplifier (S/A) 320, and a read enable transistor 81 and a clamp transistor 82 are connected between the detection circuit 300 and the global word line 63.

The read operation will be specifically described hereinafter with reference to FIGS. 7A to 7C. FIG. 7A shows a voltage VGWL of the global word line 63 and a voltage VGBL of the global bit line 73. FIG. 7B shows a read enable signal REN applied to a gate of the transistor 81. FIG. 7C shows a current Icell that passes through the memory cell 30, that is, a current that passes through the series-connection of the magnetoresistive effect element 40 and the selector 50.

Before start of the read operation, the voltage VGWL of the global word line 63 and the voltage VGBL of the global bit line 73 are each kept at Vdd/2. In addition, the read enable signal REN is at a low level and the current Icell that passes through the memory cell 30 is zero.

When the read operation starts at a time t1, the control circuit 200 exercises control in such a manner as to charge the selected word line 10 connected to the read target memory cell (also referred to as selected memory cell) 30 and the selected bit line 20 connected to the read target memory cell 30.

Specifically, the global word line control circuit 210 charges the global word line 63 with a first voltage and the global bit line control circuit 220 charges the global bit line 73 with a second voltage. In the present embodiment, the first voltage and the second voltage are both Vdd, such that the first voltage is equal to the second voltage. At this time, the switch circuit 61 connected to the selected word line 10 and the switch circuit 71 connected to the selected bit line 20 are set into on-states. On the other hand, the switch circuit 62 connected to the selected word line 10 is set into an off-state, and the switch circuit 72 connected to the selected bit line 20 is set into an off-state. As a result, the selected word line 10 and the selected bit line 20 are each charged with the voltage Vdd. That is, the voltage with which the selected word line 10 is charged is equal to the voltage with which the selected bit line 20 is charged.

Furthermore, the switch circuit 61 connected to each non-selected word line 10 is set into an off-state, and the switch circuit 62 connected to each non-selected word line 10 is set into an on-state. Moreover, the switch circuit 71 connected to each non-selected bit line 20 is set into an off-state, and the switch circuit 72 connected to each non-selected bit line 20 is set into an on-state. Therefore, a voltage of each of the non-selected word lines 10 and the non-selected bit lines 20 is Vdd/2.

After the selected word line 10 and the selected bit line 20 are charged with the voltage Vdd as described above, the control circuit 200 exercises control in such a manner as to set the selected word line 10 and the selected bit line 20 into floating states.

Specifically, at a time t2, the global word line control circuit 210 sets the global word line 63 into a floating state and the global bit line control circuit 220 sets the global bit line 73 into a floating state. As a result, the selected word line 10 and the selected bit line 20 are set into the floating states.

After the selected word line 10 and the selected bit line 20 are set into the floating states as described above, the control circuit 200 exercises control to start discharging the selected bit line 20 at a time t3. The voltage applied to the selected memory cell 30 thereby increases and the selector 50 of the selected memory cell 30 transitions into the on-state.

Specifically, by causing the global bit line control circuit 220 to discharge the global bit line 73, the voltage of the selected bit line 20 gradually falls to Vss (e.g., zero volt).

Moreover, in the present embodiment, at the time t3, a control signal from the control circuit 200 controls the read enable signal REN to be set to a high level and the transistor to transition into an on-state. This turns the constant-current source 310 into a state of being capable of supplying a constant current to the selected memory cell 30. It is noted that timing at which the read enable signal REN transitions to the high level does not necessarily match timing at which discharging of the selected bit line 20 starts, and the read enable signal REN may transition into the high level before the detection circuit 300 actually detects the data stored in the magnetoresistive effect element 40.

When a voltage difference between the voltage of the global word line 63 and the voltage of the global bit line 73 reaches the threshold voltage Vth, that is, a voltage difference between the voltage of the selected word line 10 and the voltage of the selected bit line 20 reaches the threshold voltage Vth at a time t4, the selector 50 of the selected memory cell 30 transitions from the off-state into the on-state. As a result, an on-current is supplied from the constant-current source 310 to the series-connection of the magnetoresistive effect element 40 and the selector 50 of the selected memory cell 30, and the voltage of the selected word line 10, that is, the voltage of the global word line 63 gradually falls.

When the voltage of the global word line 63 falls, the voltage difference between the voltage of the global word line 63 and the voltage of the global bit line 73 (such difference being equal to the voltage difference between the voltage of the selected word line 10 and the voltage of the selected bit line 20) reaches the hold voltage Vhold, that is, the voltage applied to the selected memory cell 30 reaches the hold voltage Vhold at a time t5. At this time, the control signal from the control circuit 200 controls the read enable signal REN to be kept at the high level, and the transistor 81 to be set into the on-state. As a result, the on-current is continuously supplied from the constant-current source 310 to the selector 50 of the selected memory cell 30. For this reason, the selector 50 of the selected memory cell 30 is not set into the off-state and kept in the on-state. That is, after the selector 50 is set into the on-state at the time t4, the on-current is continuously passed through the selector 50.

The control circuit 200 exercises control in such a manner as to read the data (data corresponding to the low resistance state or data corresponding to the high resistance state) stored in the magnetoresistive effect element 40 of the selected memory cell 30 in the state in which the selector 50 of the selected memory cell 30 is set into the on-state and in which the voltage applied to the selected memory cell 30 (which is equal to the difference between the voltage applied to the selected word line 10 and the voltage applied to the selected bit line 20) is kept at the hold voltage Vhold.

Specifically, the sense amplifier 320 detects the cell current Icell that passes through the selected memory cell 30, thereby determining the data stored in the magnetoresistive effect element 40. As shown in FIG. 7C, anon-current (depicted as hold current Ihold1) that passes through the selected memory cell 30 when the magnetoresistive effect element 40 is in the low resistance state is higher than an on-current (depicted as hold current Ihold2) that passes through the selected memory cell 30 when the magnetoresistive effect element 40 is in the high resistance state. Therefore, the detection circuit 300 including the sense amplifier 320 detects the resistance state of the magnetoresistive effect element 40 on the basis of the on-current that passes through the selector 50 (which is equal to the on-current that passes through the selected memory cell 30), thereby determining the data stored in the magnetoresistive effect element 40. The detection circuit 300 including the sense amplifier 320 detects the resistance state of the magnetoresistive effect element 40 in the state in which the on-current that passes through the selector 50 is kept at the constant value and the voltage applied to the selected memory cell 30 is kept at the hold voltage Vhold.

It is noted that a method of determining the data stored in the magnetoresistive effect element 40 is not limited to the method described above, i.e., method of detecting the hold current Ihold that passes through the selected memory cell 30 in the state in which the voltage applied to the selected memory cell 30 is kept at the hold voltage Vhold, and other determination methods are also applicable.

As described so far, according to the present embodiment, the selector 50 is set into the on-state by charging the selected word line 10 and the selected bit line 20, and discharging the selected bit line 20 set into the floating state and increasing the voltage applied to the selected memory cell 30. It is, therefore, possible to reliably set the selector 50 into the on-state and reliably read the data stored in the magnetoresistive effect element 40 in the state in which the selector 50 is set into the on-state.

Furthermore, the constant-current source 310 supplies the constant on-current to the selected memory cell 30 before the voltage applied to the selected memory cell 30, that is, the voltage applied between the selected word line 10 and the selected bit line 20 reaches the hold voltage Vhold. As a result, it is possible to reliably read the data stored in the magnetoresistive effect element 40 in the state in which the selector 50 is set into the on-state without transition of the selector 50 into the off-state.

FIGS. 8A to 8C are timing charts illustrating another example of the read operation carried out by the storage device according to the present embodiment.

The read operation shown in FIGS. 8A to 8C is basically similar to the read operation shown in FIGS. 7A to 7C described above. However, the read operation shown in FIGS. 8A to 8C differs from the read operation shown in FIGS. 7A to 7C in the following respects. In the read operation shown in FIGS. 7A to 7C, the global word line 63 and the global bit line 73 are made to transition into the floating states in the state in which the global word line 63 and the global bit line 73 are each charged with the voltage Vdd. In the read operation shown in FIGS. 8A to 8C, by contrast, the global word line 63 and the global bit line 73 are made to transition into floating states in a state in which the global word line 63 is charged with the voltage Vdd and in which the global bit line 73 is charged with the voltage Vdd/2. That is, in the read operation shown in FIGS. 8A to 8C, the first voltage differs from the second voltage. It is noted that the first voltage and the second voltage are not limited to the value in the example of the read operation shown in FIGS. 7A to 7C or the values in the example of the read operation shown in FIGS. 8A to 8C, so long as a difference between the first voltage and the second voltage may be smaller than the threshold voltage Vth.

In the example of the read operation shown in FIGS. 8A to 8C, similarly to the read operation shown in FIGS. 7A to 7C, it is possible to produce similar effects to those in the embodiment described above, and it is similarly possible to reliably read the data stored in the magnetoresistive effect element 40 in the state in which the selector 50 is set into the on-state.

While the magnetoresistive effect element is used as the variable resistance memory element in the embodiments described above, other variable resistance memory elements may be used.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A storage device comprising:
a first interconnection extending in a first direction;
a second interconnection extending in a second direction crossing the first direction;
a memory cell connected between the first interconnection and the second interconnection and including a variable resistance memory element and a switching element that is connected in series to the variable resistance memory element between first and second ends of the memory cell respectively connected to the first and second interconnections; and
a control circuit configured to exercise control of a read operation to read data stored in the memory cell, wherein
the control circuit exercises the control of the read operation in such a manner as:
to set the first interconnection which has been charged with a first voltage and the second interconnection which has been charged with a second voltage into floating states,
after the first and second interconnections have been set into the floating states, to set the switching element into an on-state by discharging the second interconnection to thereby increase a voltage applied to the memory cell, and
to read the data stored in the memory cell by sensing a hold current that constantly passes through the memory cell in a state in which the switching element is set into the on-state and after a voltage applied across the memory cell decreases from a threshold voltage at which the switching element transitions into the on-state to a hold voltage lower than the threshold voltage.

2. The storage device according to claim 1, wherein the switching element transitions into an off-state when the voltage applied across the memory cell is lower than the hold voltage, which is higher than a zero voltage.

3. The storage device according to claim 2, wherein a difference between the first voltage and the second voltage is smaller than the threshold voltage.

4. The storage device according to claim 2, wherein a difference between a voltage applied to the first interconnection and a voltage applied to the second interconnection at a time of reading the data stored in the memory cell is equal to the hold voltage.

5. The storage device according to claim 1, wherein the first voltage is equal to the second voltage.

6. The storage device according to claim 1, wherein the first voltage differs from the second voltage.

7. The storage device according to claim 1, wherein the control circuit exercises control in such a manner that an on-current is continuously passed through the switching element after the switching element is set into the on-state.

8. The storage device according to claim 7, further comprising
a constant-current source that supplies the on-current to the switching element.

9. The storage device according to claim 1, further comprising
a detection circuit that detects the resistance state of the variable resistance memory element on the basis of an on-current that passes through the switching element.

10. The storage device according to claim 9, wherein the detection circuit detects the resistance state of the variable resistance memory element in a state in which the on-current is kept at a constant value.

11. The storage device according to claim 1, wherein the variable resistance memory element is a magnetoresistive effect element.

12. A storage device comprising:
a plurality of bit lines including a first bit line and a second bit line;
a plurality of word lines including a first word line and a second word line;
a plurality of memory cells between the bit lines and the word lines, each of the memory cells including a variable resistance element and a switching element that are connected in series between a first end connected to one of the bit lines and a second end connected to one of the word lines;
a control circuit; and
a detection circuit, wherein
during a read operation to read data stored in a target memory cell, which is one of the memory cells between the first bit line and the first word line,
while the first bit line is at a first voltage and the first word line is at a second voltage, the control circuit sets the first bit line and the first word line into floating states,
after setting the first bit line and the first word line into floating states, the control circuit discharges the first bit line and supplies a current to the switching element of the target memory cell to turn on the switching element of the target memory cell, and
after a voltage difference between the first word line and the first bit line decreases from a threshold voltage at which the switching element transitions into the on-state to a hold voltage that is less than the threshold voltage and greater than zero voltage and a hold current constantly passes through the target memory cell with the switching element in the on-state, the detection circuit detects a current that passes through the target memory cell and determines data stored in the target memory cell on the basis of the detected current.

13. The storage device according to claim 12, wherein the switching element transitions into an off-state when the voltage applied across the memory cell is lower than the hold voltage.

14. The storage device according to claim 13, wherein a difference between the first voltage and the second voltage is smaller than the threshold voltage.

15. The storage device according to claim 12, wherein the first voltage is equal to the second voltage.

16. The storage device according to claim 12, wherein the first voltage differs from the second voltage.

17. The storage device according to claim 12, wherein the control circuit continuously supplies the current to the switching element after the switching element is turned on.

18. The storage device according to claim 12, wherein the detection circuit determines that data having a first value is stored in the target memory cell when the detected current is a above a reference level and data having a second value is stored in the target memory cell when the detected current is a below the reference level.

19. The storage device according to claim 12, wherein a fixed voltage is applied to the second bit line and the second word line during the read operation on the target memory cell.

20. The storage device according to claim 19, wherein the fixed voltage is equal to one-half of the first voltage.

* * * * *